United States Patent [19]
Appelt et al.

[11] Patent Number: 5,900,675
[45] Date of Patent: May 4, 1999

[54] ORGANIC CONTROLLED COLLAPSE CHIP CONNECTOR (C4) BALL GRID ARRAY (BGA) CHIP CARRIER WITH DUAL THERMAL EXPANSION RATES

[75] Inventors: Bernd Karl-Heinz Appelt, Apalachia; Donald Seton Farquhar, Endicott; Robert Maynard Japp, Vestal; Konstantinos I. Papathomas, Endicott, all of N.Y.

[73] Assignee: International Business Machines Corporation, Armonk, N.Y.

[21] Appl. No.: 08/840,518

[22] Filed: Apr. 21, 1997

[51] Int. Cl.$^6$ .................................................. H01L 23/48
[52] U.S. Cl. .................. 257/778; 257/712; 257/713; 257/737; 257/338; 257/780
[58] Field of Search ...................... 257/620, 701, 257/707, 706, 713, 720, 795, 796, 712, 778, 780, 737, 738

[56] References Cited

U.S. PATENT DOCUMENTS

| | | | |
|---|---|---|---|
| 3,290,564 | 12/1966 | Wolff, Jr. | 257/707 |
| 4,654,248 | 3/1987 | Mohammed | 428/137 |
| 4,893,172 | 1/1990 | Matsumoto et al. | 257/713 |
| 4,914,551 | 4/1990 | Anschel et al. | 361/387 |
| 4,942,076 | 7/1990 | Panicker et al. | 428/137 |
| 5,086,337 | 2/1992 | Noro et al. | 257/726 |
| 5,216,278 | 6/1993 | Lin et al. | 257/737 |
| 5,325,265 | 6/1994 | Turlik et al. | 361/702 |
| 5,338,967 | 8/1994 | Kosaki | 257/620 |
| 5,473,119 | 12/1995 | Rosenmayer et al. | 174/255 |
| 5,481,136 | 1/1996 | Kohmoto et al. | 257/712 |
| 5,493,153 | 2/1996 | Arikawa et al. | 257/796 |
| 5,572,070 | 11/1996 | Ross | 257/706 |
| 5,574,630 | 11/1996 | Kresge et al. | 361/792 |
| 5,610,442 | 3/1997 | Schneider et al. | 257/706 |
| 5,714,803 | 2/1998 | Queyssac | 257/737 |
| 5,744,863 | 4/1998 | Culnane et al. | 257/704 |
| 5,777,386 | 7/1998 | Higashi et al. | 257/737 |
| 5,786,635 | 7/1998 | Alcoe et al. | 257/778 |

OTHER PUBLICATIONS

Mok, L.S., "Thermal Management of Silicon–based Multichip Modules", Thomas J. Watson Research IBM Research Division, Yorktown Heights, NY 10598.
Wilson, J.W., "A Low–Cost Metal Ball Grid Array for Flip Chip Die", IBM Microelectronics, Endicott, *IEEE*, 1995.
"Localized Control of Thermal Expansion in Electronic Assembly", *IBM Technical Disclosure Bulletin*, 39, No. 2, Feb. 1996.
Dietsch, H.E., et al., "Film on Metal Leaded Chip Carrier", *IBM Technical Disclosure Bulletin*, vol. Jun. 1988.
Dessauer, B., et al. "Copper–Clad Invar Heatsink", *IBM Technical Disclosure Bulletin*, vol. 27, No. 11, Apr. 1985.
Gazdik, C.E., et al., "Multilayer Polymer Substrate for Direct Chip Attachment", *IBM Technical Bulletin*, vol. 32, No. 3B, Aug. 1989.
C.N. Liu, "Matching the Thermal Coefficients of Expansion of Chips to Module Substrate," *IBM Technical Disclosure Bulletin*, vol. 19, No. 12, pp. 4666–4667 (May 1977).

*Primary Examiner*—William Krynski
*Assistant Examiner*—Cathy F. Cam
*Attorney, Agent, or Firm*—Ratner & Prestia; John R. Pivnichny

[57] ABSTRACT

An integrated circuit chip package with an integrated chip carrier having differing coefficients of thermal expansion (CTE) in the x-y plane. The chip carrier is comprised of two main regions. The first is a core region having a CTE approximately equal to that of the semiconductor chip CTE. This core region also has approximately the same dimensions in the x-y plane as the semiconductor chip. The chip is mounted just above this core region. The second region is a peripheral region which surrounds the core region in the x-y plane. This second region has a CTE approximately equal to that of the printed circuit board CTE. During thermal cycling, the materials expand and contract. The core region expands at nearly the same rate as the chip and the area outside the chip footprint, the peripheral region, expands at a rate similar to that of the printed circuit board. This characteristic prevents thermal stress-induced fatigue on the package components and solder joints.

20 Claims, 3 Drawing Sheets

ORGANIC CONTROLLED COLLAPSE CHIP CONNECTOR (C4) BALL GRID ARRAY (BGA) CHIP CARRIER WITH DUAL THERMAL EXPANSION RATES

BACKGROUND OF THE INVENTION

1. Field of the Invention

The present invention relates generally to integrated circuits and, more particularly, to an integrated circuit (chip) carrier with zones in the x-y plane of controlled coefficients of thermal expansion.

2. Background of the Invention

The reliability and performance of integrated circuit packages is enhanced by matching the coefficient of thermal expansion (CTE) of the printed circuit board and the semiconductor chip. Such a structure prevents discontinuous expansion during thermal cycling and its resultant stresses on the chip package components. Generally, however, a chip has a CTE of 2.7 ppm/C° and the printed circuit board has a CTE of 10 to 25 ppm/C°. This mismatch is especially a problem where ball grid array (BGA) interconnections and controlled collapse chip connector (C4, or "flip chip") technologies are used. Often, chip carriers are interposed between the chip and the circuit board; the CTE of the chip carrier is itself chosen as some intermediate value to provide a reasonable match to both the chip and to the printed circuit board.

In the progression of chip package technology development, as chip input-output (I/O) increased beyond the capabilities of peripheral lead devices, BGA interconnections and other soldered interfaces emerged as the solution. Where the CTE of the chip does not match the CTE of the circuit board, however, the footprint size of the BGA and C4 interconnections is limited because of stress-induced fatigue on the solder joints during thermal cycling.

Thermal cycling is encountered during normal circuit operation and, where the CTEs of the package components do not match, movement of the chip with respect to the circuit board results. The use of standard area array soldering to join the carrier to the board often provides an insufficient mechanical fatigue strength to mediate a significantly different expansion of the two materials. Consequently, under conditions of thermal cycling, the solder joints break, disrupting the circuit operation and necessitating repair.

To strengthen the carrier-to-substrate bond, attempts were made to increase the diameter of the connection, thus rendering the bond connection more compliant. When this is done, however, pin out density is decreased dramatically. For example, when similar materials are used for the carrier and board, a contact area of 0.25 mm (10 mils) with a gap between contacts of 0.25 mm (10 mils) provides a contact array having a 0.50 mm (20 mils) pitch. When dissimilar materials are used for the carrier and board, a 1.0 mm (40 mils) contact must be provided which results in a contact array having a 1.25 mm (50 mils) pitch. Such a decrease in pin out density is undesirable.

The use of heatsinks was another proposed solution to the problems with organic chip carriers and the related poor thermal conductivity associated with BGA technology. Heatsinks were employed to manage the thermal and power performance requirements of these packages, but the CTE mismatch still remained. Thus, although heat accumulation was decreased, mechanical failure within the chip due to stress and cracking still existed.

Some partial solutions to the above problems eventually emerged. One solution was to provide a separate connection system to relieve the CTE mismatch. Such connection systems included flex cables or sockets. Most of the past solutions employed some type of interface between the chip and the printed circuit board. The material for the interface was selected such that it had an intermediate CTE within the CTE range of both the chip and board.

Thus, FIG. 1A depicts a wirebond BGA package, where a baseplate 10 (CTE of 17 ppm/C°) would be provided with a CTE near that of the printed circuit board 20 (CTE of 20 to 25 ppm/C°). The chip 30 has a CTE of about 2 ppm/C°. Thus, the baseplate 10 would provide an intermediate match to the printed circuit board 20 and the chip 30. It is more important that the baseplate 10 come close to matching the printed circuit board, because the thermally induced stresses increase directly with the overall size of the mismatched interface. For this type of structure, the overall size of the BGA array is always larger than the chip size. Furthermore, the wirebond interconnections 26 are somewhat compliant, as is the adhesive 36 connecting the chip to the baseplate. Also illustrated in FIG. 1A are the solder balls 22, which connect the circuitry (not shown in FIG. 1A) on the surface of the baseplate 10 to the printed circuit board 20 and the molding compound or encapsulant 24 which encapsulates chip 30.

FIG. 1B shows a C4 flip chip BGA package, where a chip 30 (about 2 ppm/C°) is connected using C4 solder balls 42 to a baseplate 10. The C4 interconnections are reinforced with an encapsulant 36. The C4's are connected to the BGA balls 22 with circuitry (not shown) on the baseplate 10. The BGA balls 22 connect to the printed circuit board 20. This type of package offers more dense interconnections than the package shown in FIG. 1A, but the C4 connections are less compliant than wirebond connections, thus requiring a closer match in CTE between the chip 30 and the baseplate 10.

The partial solutions illustred in FIGS. 1A and 1B can be optimized to provide the best possible compromise of CTEs among the various components. When the temperature of the package increases during operation, however, the printed circuit board 20 expands the most, the chip 30 expands the least, and the baseplate 10 expands at some intermediate value. Although it is intended for intermediate expansion of the baseplate 10 to reduce the thermal stress, it is not eliminated. As the array size of the BGA interconnections grows, and as the chip size increases, the CTE mismatch becomes increasingly problematic, resulting in reliability and performance problems.

Another proposed solution is to have a carrier with a CTE varying in the z-plane (where z is the thickness). This proposed solution matches the CTE of the chip on one side of the baseplate and the CTE of the printed circuit board on the other side of the baseplate. This layered baseplate, however, causes warping during processing because each layer expands at a different rate. Thus, the problem of preventing BGA and C4-ball shear and chip cracking remains unsolved.

Other alternatives include full compensation planes and chip encapsulation. These alternatives tend, however, to restrict the size of the chip carrier. Still another proposed solution is to incorporate low CTE materials such as INVAR (INVAR is a registered trademark of Creusot-Loire used in connection with a steel alloy containing 36% nickel) or quartz into the laminate. If the overall CTE is lowered too much, however, BGA failure results. And chip cracking and C4 failure can result if the CTE is not lowered enough. Therefore, this proposed solution also has drawbacks and there remains a need for a chip package which removes the stresses caused by inconsistent expansion during thermal cycling.

To overcome the CTE shortcomings of conventional integrated circuit chip packages, a new integrated circuit chip package is provided. An object of the present invention is to provide a package with improved CTE matches between the chip and carrier and between the carrier and the printed circuit board. A related object is to improve these CTE matches in BGA applications. Another object is to reduce thermal stress, and resulting defects, without limiting the size of the chip or chip carrier. Yet another object of the present invention is to provide a package which minimizes warping.

SUMMARY OF THE INVENTION

To achieve these and other objects, and in view of its purposes, the present invention provides an integrated circuit chip package wherein the chip carrier is an integrated piece with differing coefficients of thermal expansion in the x-y plane. The carrier has two main regions. One region is a core region which has a CTE approximately equal to the semiconductor chip. This region is approximately the same size as the chip, and is effectively the chip footprint. The second region surrounds the core region in the x-y plane and has a CTE approximately equal to the printed circuit board. Because the CTE varies in the x-y plane, and not the z-plane as in some layered carriers of the past, warping is minimized. The core region has a CTE <5 ppm/C°, and is comprised of INVAR, or of any other related material which provides the necessary properties. The surrounding region is copper or a suitable similar metal, and has a CTE of 15–25 ppm/C° or, alternatively, a printed circuit board laminate.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention utilizes a baseplate that has an in-plane variation of its thermal expansion. Specifically, the baseplate has low expansion (<5 ppm/C°) under the chip and high expansion (about 17 ppm/C°) away from the chip. The low expansion area of this carrier minimizes the stresses in the bondline of back bonded chips, and minimizes the shear stress on the C4-balls (ball shear) and prevents chip cracking. The high expansion area minimizes the stresses on the BGA solder balls in the connection to the printed circuit board.

Figure 2:
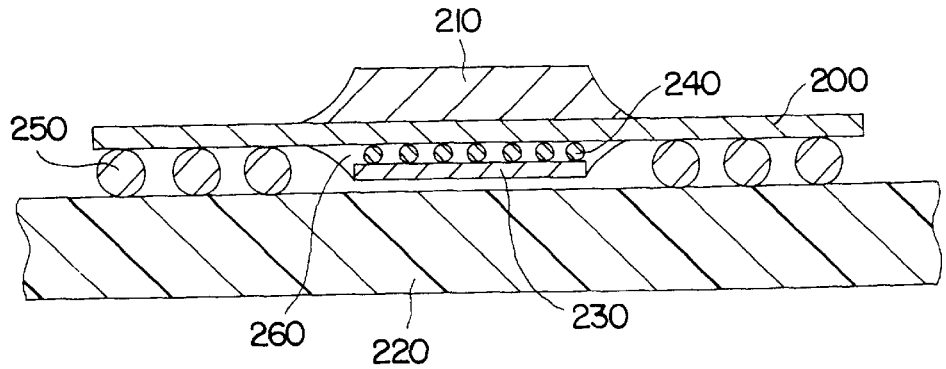
FIG. 2 is a cross-sectional view of a chip package according to the present invention where the chip is mounted to the baseplate via C4 interconnections.

FIG. 2 shows a cross-sectional view of one embodiment of the present invention. This figure shows that the x-y plane variation of thermal expansion is accomplished by using a baseplate constructed of two metals, each having a different CTE. In FIG. 2, the baseplate 200 is copper having a CTE of about 17 ppm/C°. A printed circuit board 220 has a CTE of 15–25 ppm/C°. A semiconductor chip 230 has a CTE of approximately 2 ppm/C°. Baseplate 200 is reinforced by a piece of INVAR material 210, having a CTE <5 ppm/C° and typically about 3 ppm/C°, only in the core region of asplate 200 directly above chip 230 INVAR reinforcement 210, with its CTE close to that of chip 230, lowers the composite CTE of the integral baseplate 200 and reinforcement 210 and restrains baseplate 200 from moving in this core region during thermal cycling and, therefore, prevents stresses on the C4 interconnections 240. INVAR reinforcement 210 contacts baseplate 200 continuously along their mutual interface and forms an integral carrier. Thus, other than in the transition region, there is no variation of CTE along the z-axis.

Away from the footprint of chip 230 on baseplate 200, where the BGA solder balls 250 connect baseplate 200 to printed circuit board 220, baseplate 200 is free to expand and contract during thermal cycling without applying stress on chip 230 or its mounting components. On the perimeter of baseplate 200, without reinforcement 210, the CTE of baseplate 200 approximates the CTE of printed circuit board 220. A step or tapered transition may exist from the core region to the surrounding perimeter region, where the CTE varies between the core region CTE and the surrounding region CTE. Chip 230 and C4 interconnections 240 (typically solder balls having a diameter of 0.05–0.15 mm (2–6 mils)) are surrounded by a molding compound 260 which acts as an encapsulating material for chip 230 and C4 interconnections 240. Molding compound 260 has a CTE of approximately 20–25 ppm/C°, nearly matching the CTE of C4 interconnections 240. The circuit pattern providing the fan out from the C4 balls to the solder balls is not shown, nor is the circuit pattern on the printed circuit board.

An additional advantage to the present invention concerns warping during thermal cycling. Because the INVAR layer can be incorporated symmetrically with respect to the z-axis (not shown in FIG. 2), little or no warping will occur during temperature fluctuations. As a result, because no compromise is required between the CTE of chip 230 and printed circuit board 220, the carrier will exhibit enhanced reliability.

Figure 1A:
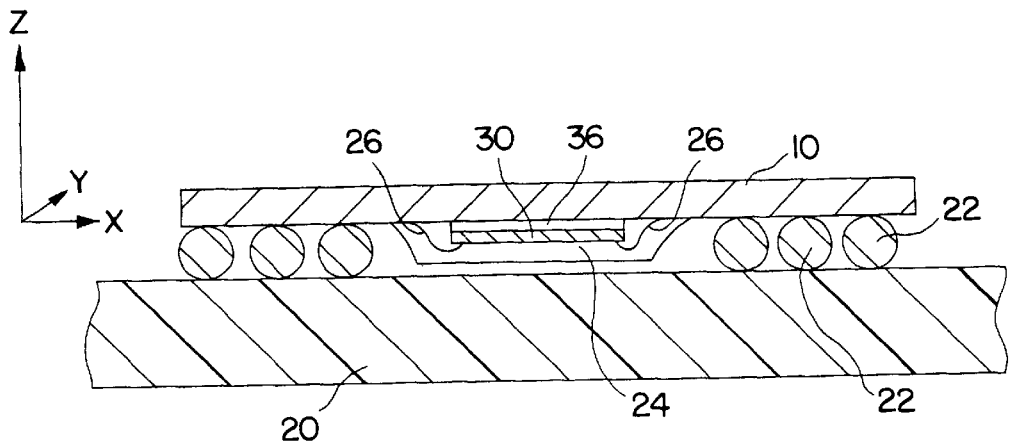
FIG. 1A is a cross-sectional view of a chip package according to the prior art.
Figure 1B:
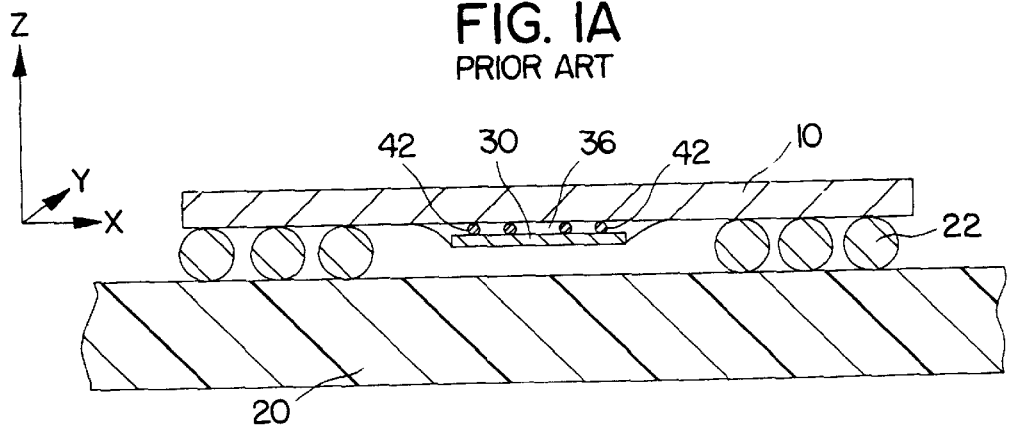
FIG. 1B is a cross-sectional view of an alternative chip package according to the prior art.

The present invention applies equally well whether the interconnection between the circuitry on baseplate 200 and chip 230 is made using wire bond (as shown in FIG. 1) or C4 technology (as shown in FIG. 2). The C4 interconnection permits denser placement of components, which is advantageous, but presents a greater thermal expansion mismatch problem than does the wire bond interconnection.

Figure 3A:
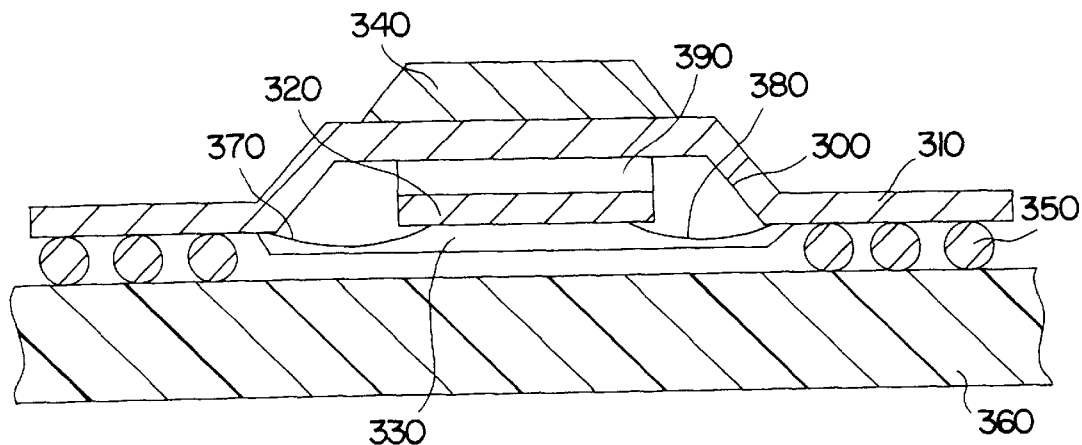
FIG. 3A is a cross-sectional view of a chip package according to the present invention where the chip is mounted via wire bonding in a cavity in the baseplate.

FIG. 3A is a further exemplary embodiment of the present invention. A cavity 300 is provided in baseplate 310. Cavity 300 provides increased area for chip 320 and overmold 330. Such increased area is important because chip 320 must not extend too far away from baseplate 310 and toward printed circuit board 360; certainly, neither chip 320, nor wirebonds, nor overmold can contact printed circuit board 360 because of interference with the BGA solder connection to the board.

In addition, it is desirable to have chip 320 in the same plane as the surrounding baseplate 310. Cavity 300 provides the necessary space for chip 320 and adhesive layer 390, while allowing the in-plane placement of chip 320. Cavity 300 also facilitates assembly because it provides ample clearance for cleaning.

Cavity 300 can be etched into the carrier. Alternatively, baseplate 310 can be stamped or coined to distort the baseplate and form cavity 300. A result of the stamping or coining technique is illustrated in FIG. 3A. Baseplate 310 is continuous and is restrained in the area of the footprint of chip 320 by the INVAR reinforcement 340. FIG. 3A also shows an embodiment in which chip 320 is connected to the circuitry on baseplate 310 using wire bonding (note wires 370 and 380), and mounted on an adhesive layer 390. BGA solder balls 350 connect baseplate 310 to printed circuit board 360.

Figure 3B:
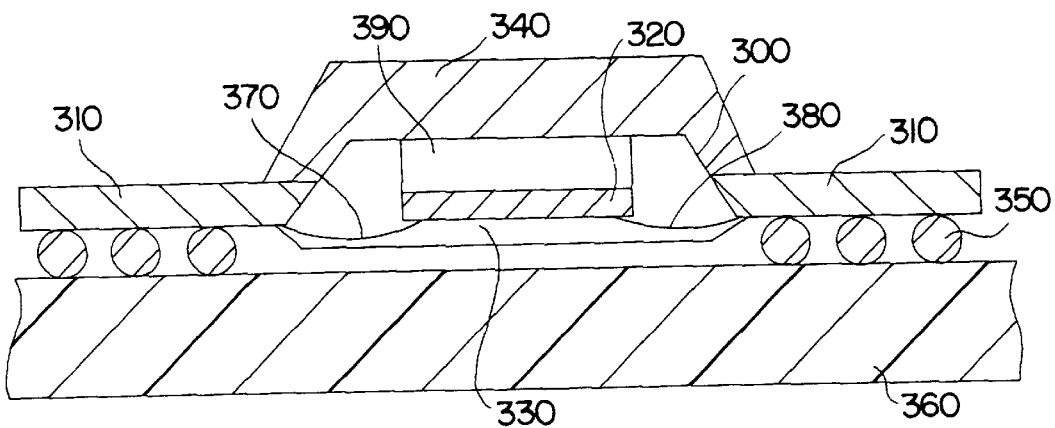
FIG. 3B is a cross-sectional view of a chip package according to the present invention where the chip is mounted via wire bonding in a cavity in a discontinuous baseplate.

FIG. 3B illustrates baseplate 310 which has been etched to form cavity 300. Baseplate 310 is not continuous. Rather, in the embodiment of FIG. 3B, cavity 300 is covered for most of its inner surface by INVAR reinforcement 340. The same low CTE area at the footprint of chip 320 is accomplished in this embodiment.

There are additional considerations that one of ordinary skill in the art would consider in utilizing this invention. For example, in developing the carrier, stress concentrations in the transition region may best be avoided by tapering the INVAR reinforcement or by having fingers of INVAR material protrude into the baseplate in the chip footprint area. One such configuration is shown in FIG. 4.

Figure 4:
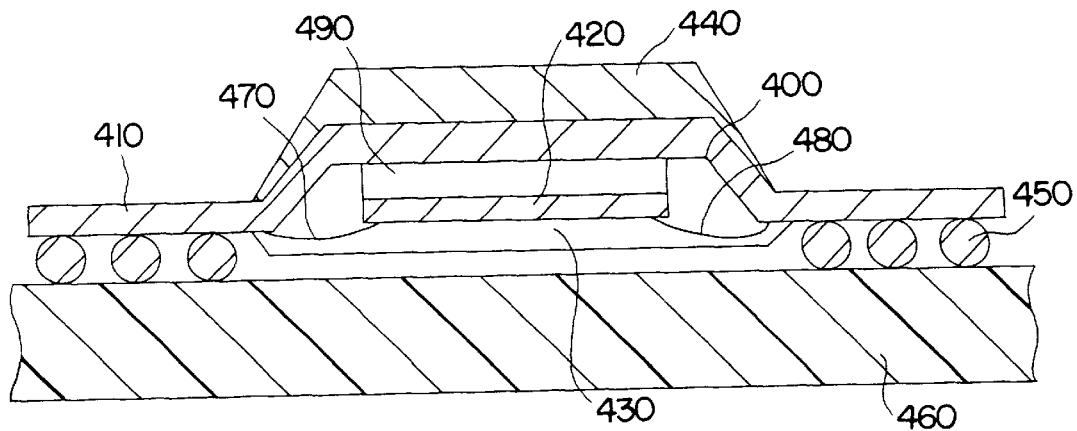
FIG. 4 is a cross-sectional view of an alternative embodiment of the present invention in which a controlled transition region is provided.

In FIG. 4, a cavity 400 is provided in baseplate 410. Cavity 400 provides increased area for chip 420 and overmold 430. BGA solder balls 450 connect baseplate 410 to printed circuit board 460. Wires 470 and 480 connect chip 420 to the circuitry on baseplate 410, and chip 420 is mounted on an adhesive layer 490. INVAR reinforcement 440 is tapered in the transition area between the core region of the footprint of chip 420 and the peripheral region. Thus, unlike the step transition which exists from the core region to the surrounding perimeter region in the embodiments discussed above, the CTE gradually varies between the core region CTE and the surrounding region CTE for the embodiment illustrated in FIG. 4.

Figure 5:
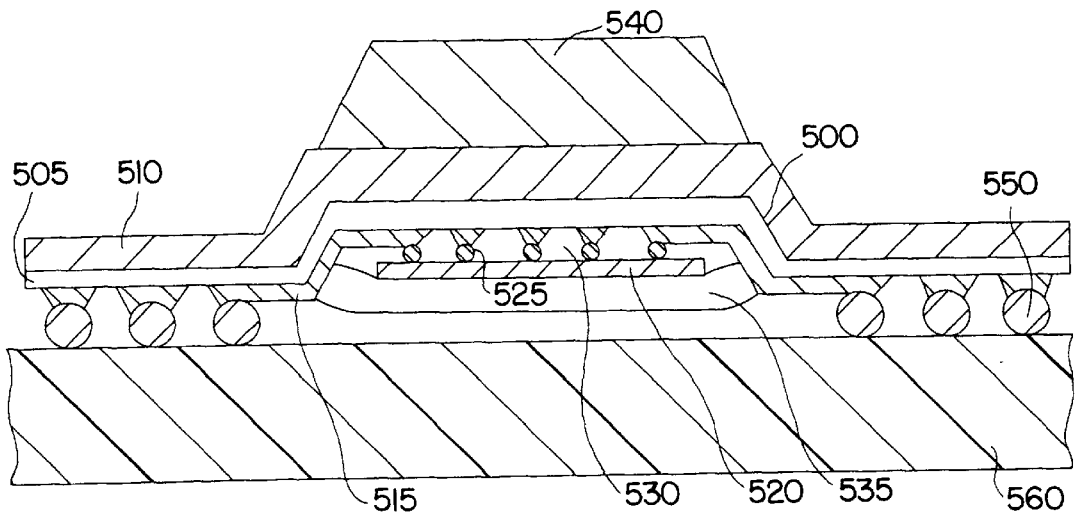
FIG. 5 is a cross-sectional view of a chip package according to the present invention in which there is an insulating layer separating the BGA and the baseplate.

FIG. 5 is yet another embodiment of the present invention. Here, the circuit lines 515 on the surface of baseplate 510 are illustrated. Circuit lines 515 are typically made of a copper—chromium composite. An insulating layer 505 is provided between baseplate 510 and circuit lines 515. Polyimide or other similar materials may be used for insulating layer 505. Cavity 500 provides increased area for chip 520 and underfill 530 or overmold 535. BGA solder balls 550 connect baseplate 510 to printed circuit board 560. INVAR reinforcement 540 is provided in the core region of the footprint of chip 520. C4 interconnections 525 (typically solder balls) connect circuit lines 515 to chip 520. By using a laser direct write tool in conjunction with ED-resist, circuitization over the sloped step of cavity 500 can be achieved providing an escape pattern for C4 mounted chip 520.

Figure 6:
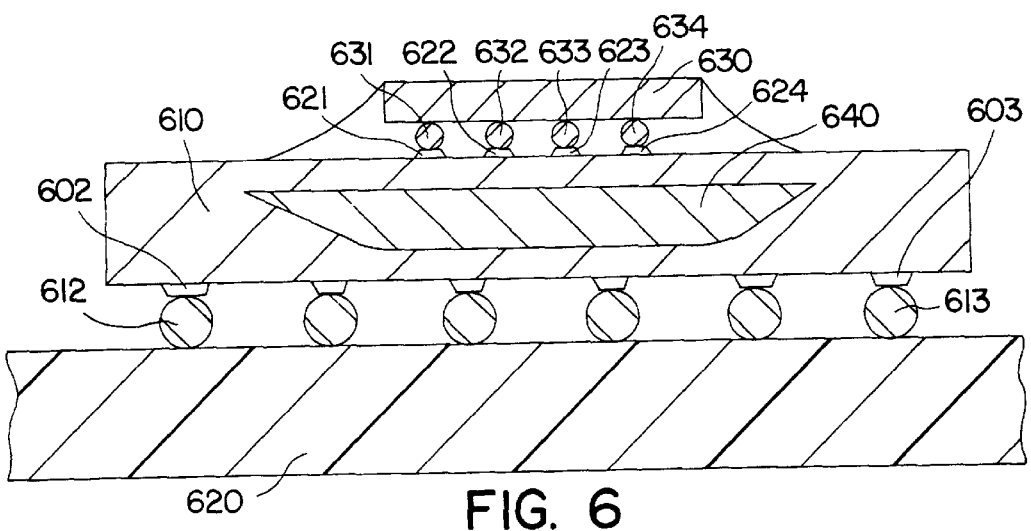
FIG. 6 is a cross-sectional view of an alternative embodiment of the present invention in which a laminate chip carrier is provided between a chip and a printed circuit board.

FIG. 6 is yet another embodiment of the present invention. In this embodiment, a laminate chip carrier 610 is disposed between the printed circuit board 620 and the chip 630. Moreover, the laminate chip carrier 610 and the printed circuit board 620 are on the same side of chip 630. Additionally, INVAR reinforcement 640 is provided within the laminate chip carrier 610, again forming the core region having approximate dimensions defined by the footprint of chip 630. FIG. 6 also shows BGA contact pads, examples being BGA contact pads 602 and 603, between the BGA solder balls, examples being BGA solder balls 612 and 613, and the laminate chip carrier 610. Similarly, C4 interconnection contact pads 621, 622, 623, and 624 are shown disposed between C4 interconnections 631, 632, 633, and 634, respectively, and the laminate chip carrier 610. The INVAR reinforcement 640 may be tapered on its edges to form a transition region providing varying thermal expansion control in the x-y plane. As an alternative to INVAR, silica fabric may be used to provide the local reduction in CTE.

Figure 7:
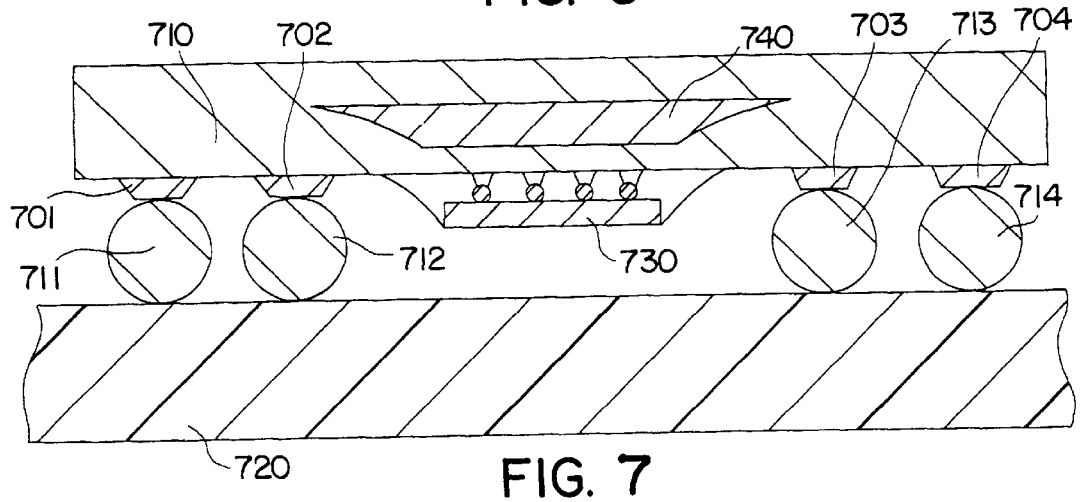
FIG. 7 is a cross-sectional view of an alternative embodiment of the present invention in which a material of low thermal expansion is disposed within an organic carrier.

FIG. 7 is yet another embodiment of the present invention. Here, the INVAR reinforcement 740 is provided within the laminate chip carrier 710, and the chip 730 is provided between the laminate chip carrier 710 and the printed circuit board 720. BGA contact pads 701, 702, 703, and 704 are shown between BGA solder balls 711, 712, 713, and 714, respectively, and chip carrier 710. FIG. 7 shows an embodiment where no internal circuitry is required. All circuitry can be on the surface of laminate chip carrier 710 where BGA contact pads contact the BGA solder balls. Again, the INVAR reinforcement 740 may be tapered on its edges to form a transition region providing varying thermal expansion control in the x-y plane. Note that the use of circuitized cores with plated through holes to form a multi-layer printed circuit board is possible as long as at least one layer has an INVAR reinforcement.

Alternative materials may be used in place of INVAR to form the integral carrier and to control CTE mismatch. Some examples of alternative materials include polyimide e-glass, polyimide quartz, quartz, aramid, molybdenum, s-glass, liquid crystal polymers, and combinations thereof. The CTE of quartz, for example, is about 5 ppm/C°. The material selected must satisfy the necessary CTE requirements and form a continuous bond with the baseplate, thereby creating an integral carrier. In the core region of the baseplate directly above the chip, the CTE can be tailored to match that of a ceramic, such as $Al_2O_3$ (of about 7 ppm/C°), typically used as a substrate. The reliability of large C4 chips on such substrates has been proven.

Beyond the region of the chip footprint, the reinforcement material (quartz, INVAR, or the like) is reduced or completely eliminated. The outer, peripheral region corresponds to the high DNP BGA sites and can be matched to the printed circuit board. The high-CTE region minimizes the stresses on the BGA solder balls in the connection to the printed circuit board. Directly under the chip, where the CTE is low, the BGAs are close to the neutral position so the mismatch to the printed circuit board is largely irrelevant. The low-CTE region of the carrier minimizes the stresses in the bondline of back-bonded chips and the C4 balls (ball shear) and the stresses that can cause chip cracking. Should the BGA stresses be excessive in the low-CTE region of the carrier, the BGA grid can be depopulated in this region.

Although the invention is quite general and would work with a variety of material sets, two specific processes of fabrication will be described. The first fabrication process begins with a piece of copper-INVAR-copper (CIC) or any other suitable metal composite such as SILVAR™ (a nickel-iron-cobalt alloy) or KOVAR™ (a related alloy). CIC is a standard material and is simply a layered laminate with a layer of copper on each side of a layer of INVAR material. The carrier is built by removing one layer of copper and further selectively removing the INVAR material from areas outside the chip footprint. The result is a carrier that has variations of CTE only in the x-y plane, with a transition region between the inner core and outer periphery. Such a construction technique could be used in multiple layers within the same carrier, following standard circuit board construction techniques. A dielectric would be required to fill areas where the CIC was thinner (e.g., prepunched prepreg may be used), and this would further enhance the x-y plane CTE variation that is accomplished by the invention. Vias under the chip may be etched into the CIC (or drilled) Employing a grid pattern of holes may also moderate the expansion of the CIC block.

An alternative fabrication process is to incorporate pre-cut pieces of quartz glass cloth, either woven or non-woven, or some other low-CTE reinforcement, in the footprint area directly beneath the chip. This additional layer of material could be impregnated with epoxy, or might rely on adjacent pre-preg for epoxy. Outside of this footprint region, normal e-glass pre-preg could be used. It may or may not be necessary to cut corresponding holes in the glass pre-preg to match the quartz inserts. One of ordinary skill in the art could determine this based on the final CTE design parameters.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An integrated circuit chip package comprising:
   a printed circuit board with a coefficient of thermal expansion;
   a semiconductor chip with a footprint and a coefficient of thermal expansion; and
   an integrated chip carrier laminate having:
      a top and a bottom surface parallel in the x-y plane,
      a thickness in the z plane,
      a circuit line,
      a core region defined by said footprint of said semiconductor chip, said core region disposed adjacent to said semiconductor chip and having a reinforcement with a coefficient of thermal expansion approximately equal to said coefficient of thermal expansion of said semiconductor chip, and
      a peripheral region surrounding said core region in the x-y plane in the region away from said semiconductor chip and having a coefficient of thermal expansion greater than said coefficient of thermal expansion of said core region;
   said semiconductor chip contacting said circuit line.

2. The circuit chip package of claim 1 wherein said core region of said integrated chip carrier laminate is comprised of steel/nickel alloy material and copper.

3. The circuit chip package of claim 1 wherein said core region of said integrated chip carrier laminate has approximately the same dimensions in the x-y plane as said semiconductor chip, and said core region is disposed directly beneath said semiconductor chip.

4. The circuit chip package of claim 1 wherein said semiconductor chip is wire bonded to said circuit line.

5. The circuit chip package of claim 1 wherein said semiconductor chip is connected to said circuit line using flip chip interconnections.

6. The circuit chip package of claim 1 wherein said core region of said integrated chip carrier laminate is farther from said printed circuit board in the z-plane than said peripheral region, said semiconductor chip residing under a cavity within said core region.

7. The circuit chip package of claim 1 wherein said core region of said integrated chip carrier laminate is comprised of at least one material selected from the group consisting of quartz, polyimide e-glass, polyimide quartz, aramid, molybdenum, s-glass, liquid crystal polymers, and combinations thereof.

8. The circuit chip package of claim 1 wherein said chip carrier further comprises an insulating layer to which said circuit line is attached.

9. The circuit chip package of claim 1 wherein the transition between said core region and said peripheral region of said chip carrier is a step.

10. The circuit chip package of claim 1 wherein the transition between said core region and said peripheral region of said chip carrier is gradual.

11. The circuit chip package of claim 1 wherein said core region extends into said peripheral region with decreasing thickness in the z plane.

12. The circuit chip package of claim 1 wherein said core region is surrounded by said peripheral region in the z plane.

13. An integrated circuit chip package comprising:
   a printed circuit board with a coefficient of thermal expansion;
   a semiconductor chip with a footprint and a coefficient of thermal expansion; and
   an integrated chip carrier laminate having:
      a top and a bottom surface parallel in the x-y plane,
      a thickness in the z plane,
      a circuit line,
      a core region defined by said footprint of said semiconductor chip, said core region disposed directly beneath said semiconductor chip and having a reinforcement with a coefficient of thermal expansion approximately equal to said coefficient of thermal expansion of said semiconductor chip, and
      a peripheral region surrounding said core region in the x-y plane in the region away from said semiconductor chip and having a coefficient of thermal expansion greater than said coefficient of thermal expansion of said core region;
      said semiconductor chip contacting said circuit line and being mounted to said integrated chip carrier laminate using flip chip interconnections.

14. The circuit chip package of claim 13 wherein said core region is surrounded by said peripheral region in the z plane.

15. The circuit chip package of claim. 13 wherein said core region of said integrated chip carrier laminate is comprised of steel/nickel alloy material and copper.

16. The circuit chip package of claim 13 wherein said core region of said integrated chip carrier laminate is comprised of at least one material selected from the group consisting of quartz, polyimide e-glass, polyimide quartz, aramid, molybdenum, s-glass, liquid crystal polymers, and combinations thereof.

17. The circuit chip package of claim 13 wherein the transition between said core region and said peripheral region of said chip carrier is a step.

18. The circuit chip package of claim 13 wherein the transition between said core region and said peripheral region of said chip carrier is gradual.

19. The circuit chip package of claim 13 wherein said core region extends into said peripheral region with decreasing thickness in the z plane.

20. The circuit chip package of claim 13 wherein said core region is surrounded by said peripheral region in the z plane.

* * * * *

UNITED STATES PATENT AND TRADE MARK OFFICE
CERTIFICATE OF CORRECTION

PATENT NO. : 5,900,675
DATED : May 4, 1999
INVENTORS : Bernd Karl-Heinz Appelt et al.

It is certified that error appears in the above-identified patent and that said Letters Patent is hereby corrected as shown below:

On the title page, item [75] Inventors address should read —Apalachin—

In column 2, line 35, delete "illustred" and insert —illustrated—.

Signed and Sealed this

Sixteenth Day of November, 1999

*Attest:*

Q. TODD DICKINSON

*Attesting Officer*  *Acting Commissioner of Patents and Trademarks*